(12) United States Patent
Manabe

(10) Patent No.: US 8,664,740 B2
(45) Date of Patent: Mar. 4, 2014

(54) SEMICONDUCTOR DEVICE AND METHOD OF PRODUCING THE SAME

(75) Inventor: Kenzo Manabe, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 556 days.

(21) Appl. No.: 12/988,977

(22) PCT Filed: Apr. 16, 2009

(86) PCT No.: PCT/JP2009/057637
§ 371 (c)(1),
(2), (4) Date: Oct. 21, 2010

(87) PCT Pub. No.: WO2009/131051
PCT Pub. Date: Oct. 29, 2009

(65) Prior Publication Data
US 2011/0037106 A1 Feb. 17, 2011

(30) Foreign Application Priority Data

Apr. 21, 2008 (JP) ................................. 2008-110124

(51) Int. Cl.
*H01L 29/47* (2006.01)

(52) U.S. Cl.
USPC ............. 257/478; 257/E29.148; 257/E29.271

(58) Field of Classification Search
USPC ........................... 257/478, E29.148, E29.271
See application file for complete search history.

(56) References Cited

U.S. PATENT DOCUMENTS

| 7,119,402 | B2 | 10/2006 | Kinoshita et al. |
| 7,312,510 | B2 | 12/2007 | Shin et al. |
| 7,525,171 | B2 | 4/2009 | Kimoto |
| 7,589,381 | B2 | 9/2009 | Kinoshita et al. |
| 2005/0093033 | A1 | 5/2005 | Kinoshita et al. |
| 2006/0131621 | A1 | 6/2006 | Shin et al. |
| 2006/0281285 | A1 | 12/2006 | Kimoto |
| 2007/0007590 | A1 | 1/2007 | Kinoshita et al. |
| 2009/0140351 | A1* | 6/2009 | Lin et al. ....................... 257/407 |
| 2009/0173973 | A1 | 7/2009 | Kimoto |

FOREIGN PATENT DOCUMENTS

| JP | 61-181156 | 8/1986 |
| JP | 62-137870 | 6/1987 |
| JP | 2005-101588 | 4/2005 |

(Continued)

OTHER PUBLICATIONS

International Search Report/ PCT/jp2009/057637/ Jul. 21, 2009.

*Primary Examiner* — Ha Tran T Nguyen
*Assistant Examiner* — Raj R Gupta
(74) *Attorney, Agent, or Firm* — Young & Thompson

(57) ABSTRACT

A semiconductor device improves a Schottky-barrier field-effect transistor. In a semiconductor device including a gate electrode formed with interposition of a gate insulating film on a channel formed on a semiconductor substrate, and a Schottky source/drain formed within a top surface of the substrate to be positioned on both sides of the gate insulating film so that end portions of the Schottky source and the Schottky drain do not cover a lower end portion of the gate insulating film and so as to form Schottky junctions with the semiconductor substrate, a Schottky barrier height at an interface between the end portion of the Schottky source and the semiconductor substrate and a Schottky barrier height at an interface between the end portion of the Schottky drain and the semiconductor substrate are different from Schottky barrier heights at interfaces between portions except the end portions of the Schottky source/drain and the substrate.

6 Claims, 12 Drawing Sheets

(56) References Cited

FOREIGN PATENT DOCUMENTS

| | | |
|---|---|---|
| JP | 2006-2179865 | 7/2006 |
| JP | 2006-278818 | 10/2006 |
| JP | 2006-351583 | 12/2006 |

\* cited by examiner

_US 8,664,740 B2_

SEMICONDUCTOR DEVICE AND METHOD OF PRODUCING THE SAME

TECHNICAL FIELD

The present invention relates to a semiconductor device and a method of producing the same and particularly to a CMOS transistor having a Schottky junction and a method of producing the same.

BACKGROUND ART

For many semiconductor integrated circuits, a field-effect MOS transistor (MOSFET) is used. What is necessary to improve the performance of integrated circuits is to improve the performance of the MOSFET. Conventionally, improvements of the performance of the MOSFET are achieved by making devices small in size. However, the problem is that as the length of a gate becomes shorter, a source diffusion layer and a drain diffusion layer become closer to each other, a depletion layer formed by each diffusion layer expands into a large portion of a channel region beneath a gate insulating film, the dominance of a gate electrode weakens, and a threshold value decreases (Short channel effect). What is proposed as a way of solving the short channel effect is a Schottky-barrier field-effect transistor (SBMOSFET) shown in FIG. 11. According to the structure, instead of an impurity diffusion layer, metal electrodes (drain silicide 11 and source silicide 12) are used as a source or drain; a Schottky junction is formed between the metal electrodes and a substrate 1. Incidentally, the reference numeral 3 represents a gate insulating film, 4 a gate electrode, and 7 a sidewall. FIG. 12A shows an energy band of the surface of a substrate of N-type SBMOSFET with zero bias. FIG. 12B shows the results of applying a bias with the gate voltage Vg>0 and the drain voltage Vd>0. In this case, electrons are poured into the channel region from the source silicide 12 thanks to a tunnel and run toward the drain silicide 11. In the case of the SBMOSFET, the depletion layer that expands in the channel region is smaller than in a MOSFET that uses a diffusion layer. Therefore, the SBMOSFET has high immunity to the short channel effect.

CITATION LIST

Patent Literature

{PTL 1} JP-A-2006-179865
{PTL 2} JP-A-2006-278818
{PTL 3} JP-A-2006-351583

SUMMARY OF INVENTION

Technical Problem

What is disclosed in PTL1 is an SBMOSFET where a side-face insulating layer is formed in the form of a spacer on a sidewall of a gate on a gate dielectric layer on a Si substrate, a source/drain is formed on both sides of a channel so as to be adjacent to the gate, and a Schottky barrier height is formed between a conductive zone of metal silicide that makes up the source/drain, a channel and a conductive zone. However, the following structure is not disclosed: Schottky barrier heights at an end portions of a Schottky source/drain are different from those at any portions other than the end portions.

What is disclosed in PTL2 is a semiconductor device having a structure in which a gate insulating film and a gate electrode are formed on a semiconductor substrate: a Schottky source/drain is formed on the semiconductor substrate, the Schottky source/drain is formed so as to be positioned on both sides of the gate insulating film, an end portion is formed so as not to cover a lower end portion of the gate insulating film, and a Schottky barrier height is put together with P and NMISFET. However, the following structure is not disclosed: Schottky bather heights at an end portions of the Schottky source/drain are different from those at any portions other than the end portions. In addition, PTL2 does not mention larger Schottky bather heights at portions other than the end portions.

What is disclosed in PTL3 is a semiconductor device where a source/drain region that is made of metal silicide is formed, a Schottky barrier is formed between the metal silicide and a silicon substrate, and a Schottky barrier height and the width thereof are practically small. However, the following structure is not disclosed: Schottky barrier heights at an end portions of the Schottky source/drain are different from those at any portions other than the end portions.

In order to obtain a high current when the SBMOSFET is on, it is necessary to reduce barrier heights formed on the source silicide and the substrate interface. However, the problem with the above is that an OFF current increases due to a thermal emission current from the source/drain.

The present invention has been made to address the above conventional problems. An object of the present invention is to solve the above problems as well as to provide a semiconductor device and a method of producing the same that can improve the characteristic of an element and reliability.

Solution to Problem

According to the present invention, there is provided a semiconductor device including a gate electrode formed with interposition of a gate insulating film on a channel formed on a semiconductor substrate, and a Schottky source and a Schottky drain that are formed within a top surface of the semiconductor substrate so as to be positioned on both sides of the gate insulating film in such a way that end portions of the Schottky source and the Schottky drain do not cover a lower end portion of the gate insulating film and so as to form Schottky junctions with the semiconductor substrate, wherein a Schottky barrier height at an interface between the end portion of the Schottky source and the semiconductor substrate and a Schottky bather height at an interface between the end portion of the Schottky drain and the semiconductor substrate are different from Schottky barrier heights at interfaces between portions except the end portions of the Schottky source and of the Schottky drain and the semiconductor substrate.

According to the present invention, there is provided a method of producing a Schottky-barrier field-effect transistor, comprising: a first step of doping channel impurities into a semiconductor substrate; a second step of forming a gate insulating film on the semiconductor substrate; a third step of forming a gate electrode on the gate insulating film; a fourth step of forming first sidewall films on side faces of the gate electrode; a fifth step of doping impurities whose polarity is opposite to that of the channel impurities with use of the gate electrode and the first sidewall films as masks; a sixth step of forming second sidewall films on sidewalls of the gate electrode and the first sidewall films; and a seventh step of doping impurities whose polarity is the same as that of the channel impurities with use of the gate electrode, the first sidewall films and the second sidewall films as masks, wherein a surface of the semiconductor is silicided to form a Schottky source and a Schottky drain, so that a dopant whose polarity is opposite to that inside the channel is segregated at interface between an end portion beneath the gate electrode of the Schottky source and the semiconductor substrate and at an interface between an end portion beneath the gate electrode of the Schottky drain and the semiconductor substrate, and so that a dopant whose polarity is the same as that inside the channel is segregated at interfaces between portions except the end portions of the Schottky source and of the Schottky drain and the semiconductor substrate.

Advantageous Effects of Invention

In an SBMOSFET of the semiconductor device of the present invention, compared with the Schottky barrier height at the interface between the end portion beneath the gate electrode of the Schottky sources and the semiconductor substrate and with the Schottky bather height at the interface between the end portion beneath the gate electrode of the Schottky drain and the semiconductor substrate, the Schottky barrier height at the interfaces between the bottom portions except the end portions of the Schottky source and of the Schottky drain and the semiconductor substrate is higher. Therefore, it is possible to realize a lower OFF current as well as to keep a high current driving capability.

According to the method of producing the semiconductor device of the present invention, the resist, ion implantation and silicidation steps that have already been established in semiconductor production processes are used to obtain the above SBMOSFET. Therefore, it is possible to realize a simple, low-cost production process.

DESCRIPTION OF EMBODIMENTS

Hereinafter, embodiments of the present invention will be described in detail with reference to the accompanying drawings.

First Embodiment

<Configuration>

Figure 1:
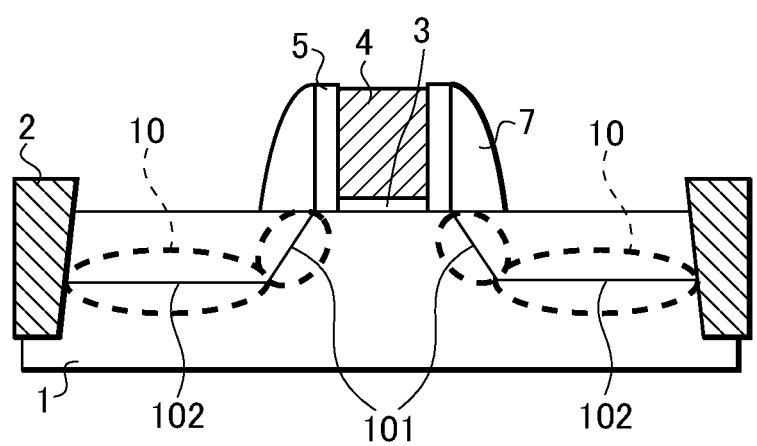
FIG. 1 A cross-sectional diagram showing a semiconductor production device according to a first embodiment of the present invention.

FIG. 1 is a cross-sectional diagram showing the configuration of an N-type SBMOSFET according to the present embodiment.

Element separations 2 are formed on a semiconductor substrate (P-type silicon substrate) 1. On the semiconductor substrate 1, a gate electrode 4 is formed with an interposition of a gate insulating film 3. On the side faces of the gate insulating film 3 and the gate electrode 4, spacers 5 and sidewalls 7 are formed. On the semiconductor substrate 1, Schottky source and Schottky drain 10 are formed: the Schottky source and Schottky drain 10 are formed in a self-aligning manner with the sidewalls 7.

More specifically, the Schottky source and Schottky drain 10 are formed within the top surface of the semiconductor substrate 1 so as to be positioned at both sides of the gate insulating film 3, with the end positions not covering a lower end portion of the gate insulating film 3.

The Schottky source and Schottky drain 10 are made of metal silicide. At the interface between end portion 101 of the Schottky source and the semiconductor substrate 1 and at the interface between end portion 101 of the Schottky drain and the semiconductor substrate 1, an N-type dopant whose polarity is opposite to that inside a channel is segregated more than a P-type dopant whose polarity is the same as that inside the channel. In addition, at the interface between bottom portion 102 except the end portion 101 of the Schottky source 10 and the semiconductor substrate 1 and at the interface between bottom portion 102 except the end portion 101 of the Schottky drain 10, the P-type dopant whose polarity is the same as that inside the channel is segregated more than the N-type dopant whose polarity is opposite to that inside the channel. Therefore, compared with a Schottky barrier height at the interface between the end portion 101 of the Schottky source 10 and the semiconductor substrate 1 and at the interface between the end portion 101 of the Schottky drain 10 and the semiconductor substrate 1, a Schottky barrier height is larger at the interfaces between the portions 102 except the end portions of the Schottky source/drain 10 and the semiconductor substrate 1.

<Production Method>

The following describes a method of producing the N-type SBMOSFET according to the present embodiment, with reference to FIGS. 2 to 5.

FIGS. 2 to 5 are process cross-sectional diagrams for explaining a method of producing the N-type SBMOSFET.

Figure 2:
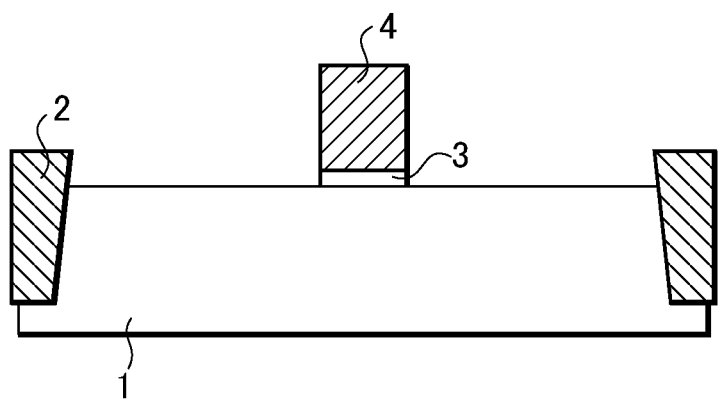
FIG. 2 A cross-sectional diagram showing a part of a process of producing the semiconductor production device according to the first embodiment of the present invention.

As shown in FIG. 2, the element separations 2 are formed on the semiconductor substrate (P-type silicon substrate) 1, and the gate insulating film 3 and the gate electrode 4 are formed on the semiconductor substrate 1. In this case, the gate insulating film 3 may be a silicone oxide film or an insulating film such as a HfSiO (hafnium silicate) film whose electric permittivity is higher than that of the silicon oxide film, a HfSiON (nitrided hafnium silicate) film that is a nitride film thereof, or a HfAlO (hafnium aluminate) film. The gate insulating film can be made so as to have a so-called equivalent oxide thickness of 0.5 to 3 nm, which is calculated from electric capacity. In this case, the gate electrode 4 may be a polysilicon film, a metal gate electrode (a metal nitride film such as TiN, or the like) that does not have gate-depletion in principle, or a laminated film where polysilicon films are stacked on a metal gate electrode. For example, the height of the gate electrode 4 may be about 100 to 150 nm.

Figure 3:
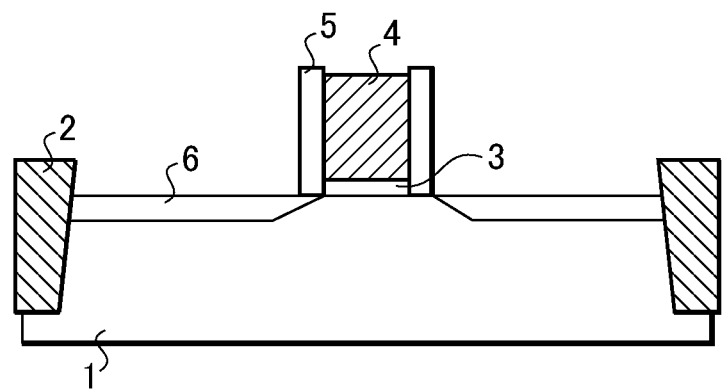
FIG. 3 A cross-sectional diagram showing another part of the process of producing the semiconductor production device according to the first embodiment of the present invention.

As shown in FIG. 3, the spacers 5 are then formed for example with a film thickness of 5 nm to 10 nm on the side faces of the gate insulating film 3 and the gate electrode 4. With the gate electrode 4 and the spacers 5 as masks, ions of an N-type dopant, which is for example arsenic (As), is implanted to form N-type diffusion regions 6.

Figure 4:
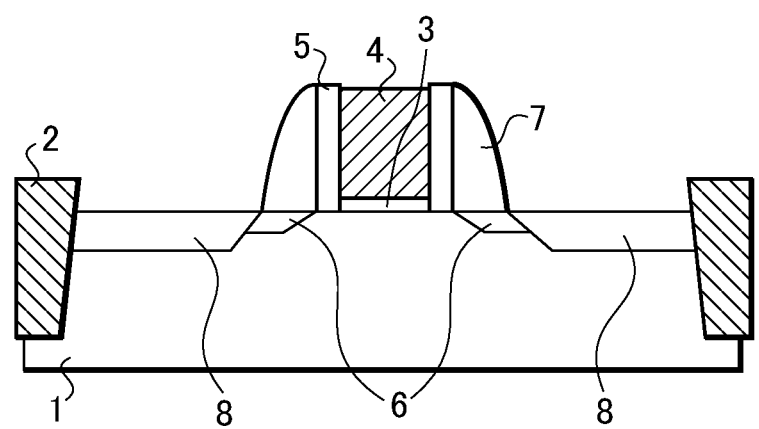
FIG. 4 A cross-sectional diagram showing still another part of the process of producing the semiconductor production device according to the first embodiment of the present invention.

As shown in FIG. 4, the sidewalls 7 are formed on the side faces of the spacers 5 for example with a film thickness of 25 nm to 50 nm. With the gate electrode 4, the spacers 5 and the sidewalls 7 as masks, a larger amount of ions of a P-type dopant, which is for example boron (B), is implanted than what is required to form the N-type diffusion regions 6 by ion implantation, so that P-type diffusion regions 8 are formed. When the P-type diffusion regions 8 are formed, as shown in FIG. 4, the implantation energy may be adjusted so that the P-type dopant is implanted deeper into the substrate than the N-type dopant.

Figure 5:
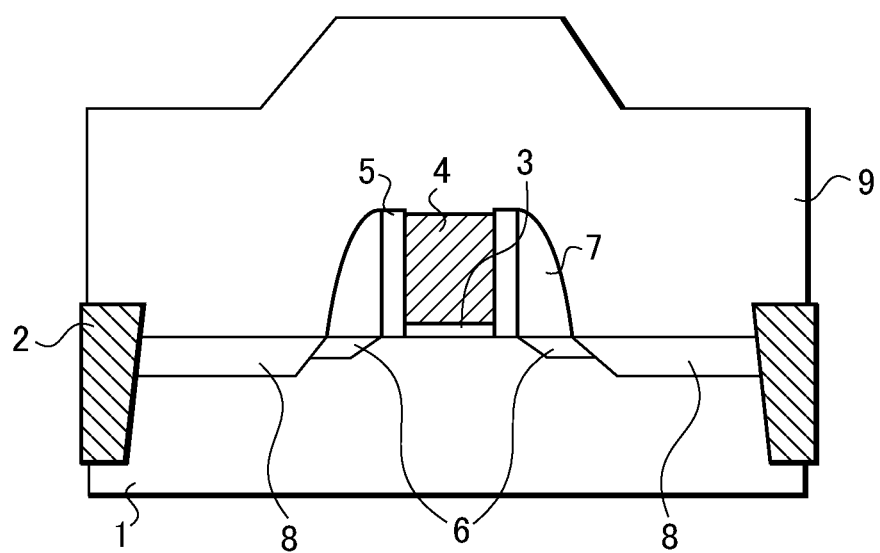
FIG. 5 A cross-sectional diagram showing a further part of the process of producing the semiconductor production device according to the first embodiment of the present invention.

Subsequently, as shown in FIG. 5, across the entire surface of the semiconductor substrate 1, a metal film 9 is formed for example with a film thickness of 10 nm: the metal film 9 such as nickel (Ni) is later used to form metal silicide. Then, the entire surface of the semiconductor substrate 1 is thermally processed at a temperature of 300 to 500 degrees Celsius. As a result, the Schottky source 10 and the Schottky drain 10 which are made of nickel silicide are formed on a source region and drain region of the semiconductor substrate 1. When the nickel silicide is formed, at the interface between the end portion 101 of the Schottky source and the semiconductor substrate 1 and at the interface between the end portion 101 of the Schottky drain and the semiconductor substrate 1, arsenic is segregated more than boron. In addition, at the interfaces between the bottom portions 102 except the end portions 101 of the Schottky source/drain 10 and the semiconductor substrate 1, boron is segregated more than arsenic. Thanks to the segregation of the dopants, compared with the Schottky bather height at the interface between the end portion 101 of the Schottky source 10 and the semiconductor substrate 1 and at the interface between the end portion 101 of the Schottky drain 10 and the semiconductor substrate 1, the Schottky barrier height at the interfaces between the bottom portions 102 except the end portions of the Schottky source/ drain 10 and the semiconductor substrate 1 is larger than the Schottky barrier height at the interface between the end portion 101 of the Schottky source and the semiconductor substrate 1 and the Schottky barrier height at the interface between the end portion 101 of the Schottky drain and the semiconductor substrate 1.

Subsequently, after the unreacted nickel, which is not associated with the formation of the nickel silicide, is removed, the N-type SBMOSFET shown in FIG. 1 is obtained.
<Effects>

According to the semiconductor device of the present embodiment, at the interface between the end portion 101 of the Schottky source and the semiconductor substrate 1 and at the interface between the end portion 101 of the Schottky drain and the semiconductor substrate 1, a dopant whose polarity is opposite to that inside the channel is segregated more than a dopant whose polarity is the same as that inside the channel. In addition, at the interfaces between the bottom portions 102 except the end portions 101 of the Schottky source/drain 10 and the semiconductor substrate 1, a dopant whose polarity is the same as that inside the channel is segregated more than a dopant whose polarity is opposite to that inside the channel. Therefore, compared with a Schottky barrier height at the interface between the end portion 101 of the Schottky source 10 and the semiconductor substrate 1 and with a Schottky barrier height at the interface between the end portion 101 of the Schottky drain 10 and the semiconductor substrate 1, a Schottky barrier height is larger at the interfaces between the bottom portions 102 except the end portions of the Schottky source/drain 10 and the semiconductor substrate 1.

Thanks to the adoption of the above configuration, it is possible to make the barrier heights at the side faces of the source and drain different from the barrier height at the bottom of the source and drain. As a result, it is possible to suppress a current from the bottom of the source and drain as well as to improve an ON current.

According to the method of producing the semiconductor device of the present embodiment, the resist, ion implantation and silicidation steps that have already been established in semiconductor production processes are used to obtain the above SBMOSFET. Therefore, it is possible to realize a simple, low-cost production process.

Second Embodiment

<Configuration>

Hereinafter, the present invention will be described in detail based on an embodiment.

Figure 6:
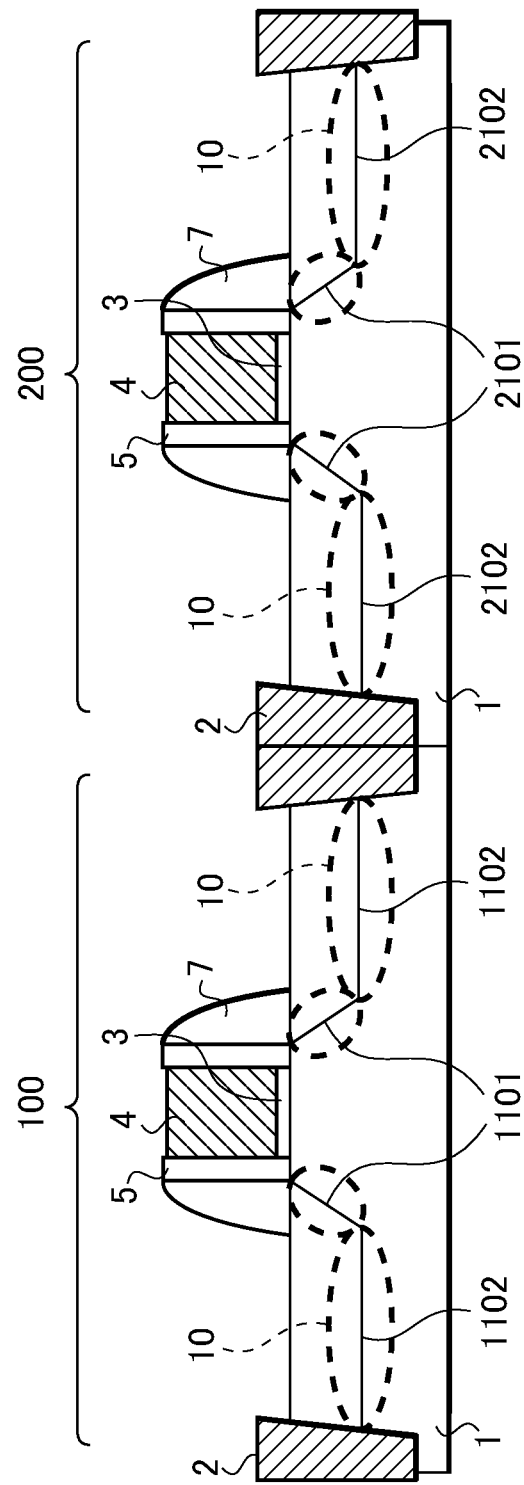
FIG. 6 A cross-sectional diagram showing a semiconductor production device according to a second embodiment of the present invention.

FIG. 6 is a cross-sectional diagram showing the configuration of a CMOS device where N-type and P-type SBMOSFETs are combined according to the present embodiment.

Element separations 2 are formed on a semiconductor substrate (P-type silicon substrate) 1. On one semiconductor surface area 100 separated, an N-type SBMOSFET is formed. On the other semiconductor surface area 200, a P-type SBMOSFET is formed. On the semiconductor substrate 1, gate electrodes 4 are formed with interpositions of gate insulating films 3. On the side faces of the gate insulating films 3 and the gate electrodes 4, spacers 5 and sidewalls 7 are formed. On the semiconductor substrate 1, Schottky sources/drains 10 are formed in a self-aligning manner with the sidewalls 7.

More specifically, the Schottky sources/drains 10 are formed within the top surface of the semiconductor substrate 1 so as to be positioned at both sides of the gate insulating films 3, with the end positions not covering lower end portions of the gate insulating films 3.

For the N-type SBMOSFET on the semiconductor surface area 100, the Schottky source/drain 10 are made of metal silicide. At the interface between end portion 1101 of the Schottky source and the semiconductor substrate 1 and at the interface between end portion 1101 of the Schottky drain and the semiconductor substrate 1, an N-type dopant whose polarity is opposite to that inside a channel is segregated more than a P-type dopant whose polarity is the same as that inside the channel. In addition, at the interfaces between bottom portions 1102 except the end portions 1101 of the Schottky source/drain 10 and the semiconductor substrate 1, the P-type dopant whose polarity is the same as that inside the channel is segregated more than the N-type dopant whose polarity is opposite to that inside the channel. Therefore, compared with a Schottky barrier height for electrons at the interface between the end portion 1101 of the Schottky source 10 and the semiconductor substrate 1 and at the interface between the end portion 1101 of the Schottky drain 10 and the semiconductor substrate 1 and the semiconductor substrate 1, a Schottky barrier height for electrons is larger at the interfaces between the portions 1102 except the end portions of the Schottky source/drain 10 and the semiconductor substrate 1.

For the P-type SBMOSFET on the semiconductor surface area 200, the Schottky source/drain 10 are made of metal silicide. At the interface between end portion 2101 of the Schottky source and the semiconductor substrate 1 and at the interface between end portion 2101 of the Schottky drain and the semiconductor substrate 1, a P-type dopant whose polarity is opposite to that inside a channel is segregated more than an N-type dopant whose polarity is the same as that inside the channel. In addition, at the interfaces between bottom portions 2102 except the end portions 2101 of the Schottky source/drain 10 and the semiconductor substrate 1, the N-type dopant whose polarity is the same as that inside the channel is segregated more than the P-type dopant whose polarity is opposite to that inside the channel. Therefore, compared with a Schottky barrier height for electron holes at the interface between the end portion 2101 of the Schottky source 10 and the semiconductor substrate 1 and with a Schottky barrier height for electron holes at the interface between the end portion 2101 of the Schottky drain 10 and the semiconductor substrate 1, a Schottky barrier height for electron holes is larger at the interfaces between the portions 2102 except the end portions of the Schottky source/drain 10 and the semiconductor substrate 1.

<Production Method>

Figure 7:
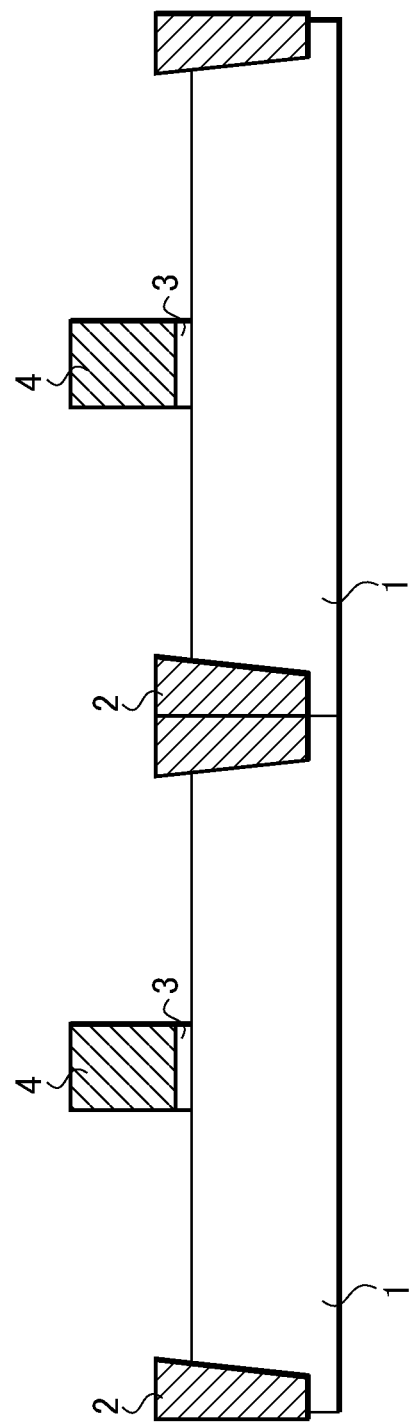
FIG. 7 A cross-sectional diagram showing a part of a process of producing the semiconductor production device according to the second embodiment of the present invention.
Figure 8:
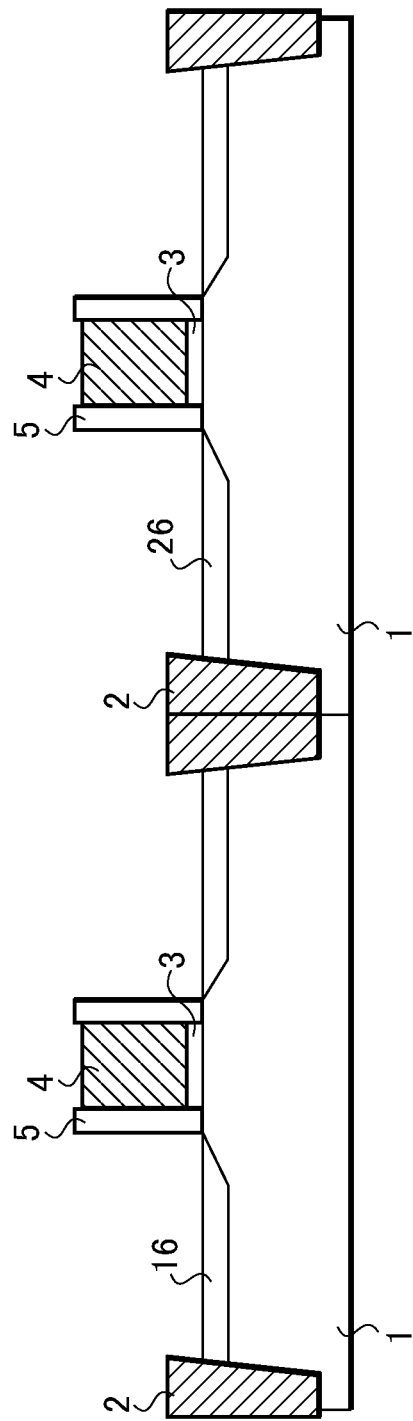
FIG. 8 A cross-sectional diagram showing another part of the process of producing the semiconductor production device according to the second embodiment of the present invention.
Figure 9:
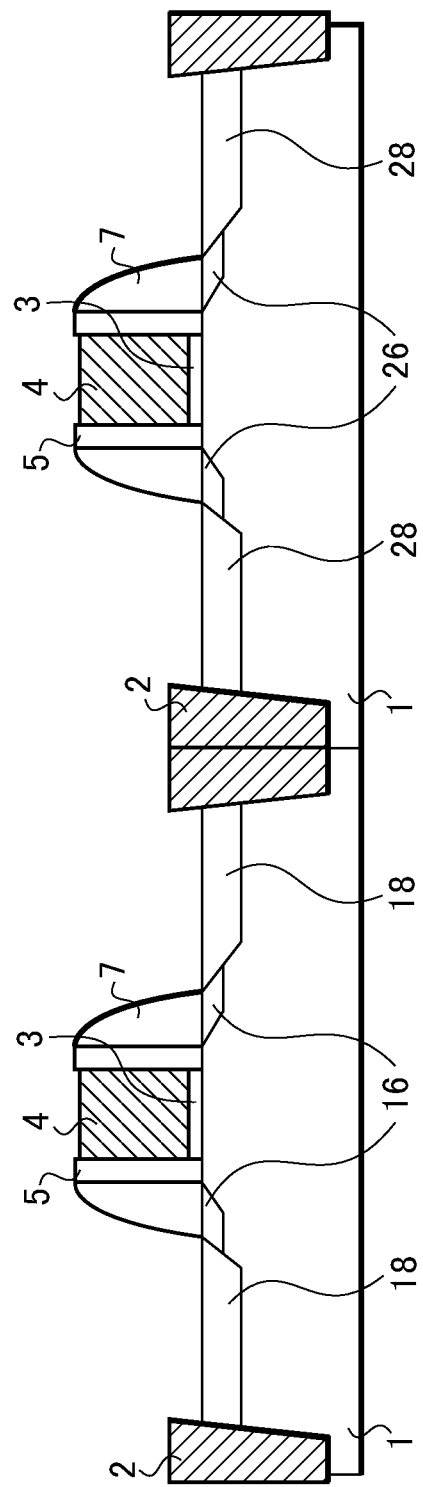
FIG. 9 A cross-sectional diagram showing still another part of the process of producing the semiconductor production device according to the second embodiment of the present invention.

The following describes a method of producing the CMOS device where the N-type and P-type SBMOSFETs are combined according to the present embodiment, with reference to FIGS. 7 to 9.

FIGS. 7 to 9 are process cross-sectional diagrams for explaining a method of producing the CMOS device where the N-type and P-type SBMOSFETs are combined.

As shown in FIG. 7, the element separations 2 are formed on the semiconductor substrate (P-type silicon substrate) 1. Then, the gate insulating films 3 and the gate electrodes 4 are formed on the semiconductor substrate 1 after ions of the P-type and N-type dopants are implanted into the semiconductor surface areas 100 and 200, respectively, for activation. In this case, the gate insulating films 3 may be silicone oxide films or insulating films such as HfSiO (hafnium silicate) films whose electric permittivity is higher than that of the silicon oxide films, HfSiON (nitrided hafnium silicate) films that are nitride films thereof, or HfAlO (hafnium aluminate) films. The gate insulating film thickness can be made so as to have a so-called equivalent oxide thickness of 0.5 to 3 nm, which is calculated from electric capacity. In this case, the gate electrodes 4 may be polysilicon films, metal gate electrodes (metal nitride films such as TiN, or the like) that do not have gate-depletion in principle, or laminated films where polysilicon films are stacked on metal gate electrodes. For example, the height of the gate electrodes 4 may fall within the range of about 100 to 150 nm.

As shown in FIG. 8, the spacers 5 are then formed for example with a film thickness of 5 nm to 10 nm on the side faces of the gate insulating films 3 and the gate electrodes 4. With the gate electrodes 4 and the spacers 5 as masks, ions of N-type and P-type dopants are implanted into the semiconductor surface areas 100 and 200, respectively, to form N-type diffusion regions 16 and P-type diffusion regions 26, respectively.

As shown in FIG. 9, the sidewalls 7 are formed on the side faces of the spacers 5 for example with a film thickness of 25 nm to 50 nm. With the gate electrodes 4, the spacers 5 and the sidewalls 7 as masks, ions of P-type and N-type dopants are implanted into the semiconductor surface areas 100 and 200, respectively, to form P-type diffusion regions 18 and N-type diffusion regions 28, respectively. In this case, a larger amount of ions of the P-type dopant is implanted into the semiconductor surface area 100 than what is required to form the N-type diffusion regions 16 by ion implantation, so that P-type diffusion regions 18 are formed. When the P-type diffusion regions 18 are formed, as shown in FIG. 9, the implantation energy may be adjusted so that the P-type dopant is implanted deeper into the substrate than the N-type dopant. In this case, a larger amount of ions of the N-type dopant is implanted into the semiconductor surface area 200 than what is required to form the P-type diffusion regions 26 by ion implantation, so that N-type diffusion regions 28 are formed. When the N-type diffusion regions 28 are formed, as shown in FIG. 9, the implantation energy may be adjusted so that the N-type dopant is implanted deeper into the substrate than the P-type dopant.

Subsequently, across the entire surface of the semiconductor substrate 1, a metal film is formed for example with a film thickness of 10 nm: the metal film such as nickel (Ni) is later used to form metal silicide. Then, the entire surface of the semiconductor substrate 1 is thermally processed at a temperature of 300 to 500 degrees Celsius. Subsequently, after the unreacted nickel, which is not associated with the formation of the nickel silicide, is removed, the CMOS device where the N-type and P-type SBMOSFETs are combined as shown in FIG. 6 is obtained.

In the CMOS device, the Schottky source 10 and the Schottky drain 10 which are made of nickel silicide are formed in the source region and drain region of the semiconductor substrate 1, respectively. In the semiconductor surface area 100, when the nickel silicide is formed, the N-type dopant is segregated more than the P-type dopant at the interface between the end portion 1101 of the Schottky source and the semiconductor substrate 1 and at the interface between the end portion 1101 of the Schottky drain and the semiconductor substrate 1. In addition, at the interfaces between the bottom portions 1102 except the end portions 1101 of the Schottky sources/drains 10 and the semiconductor substrate 1, the P-type dopant is segregated more than the N-type dopant. Thanks to the segregation of the dopants, compared with the Schottky bather height at the interface between the end portion 1101 of the Schottky source 10 and the semiconductor substrate 1 and with the Schottky barrier height at the interface between the end portion 1101 of the Schottky drain 10 and the semiconductor substrate 1, the Schottky barrier height at the interfaces between the bottom portions 1102 except the end portions of the Schottky sources/drains 10 and the semiconductor substrate 1 is larger. In the semiconductor surface area 200, when the nickel silicide is formed, the P-type dopant is segregated more than the N-type dopant at the interface between the end portion 2101 of the Schottky source and the semiconductor substrate 1 and at the interface between the end portion 2101 of the Schottky drain and the semiconductor substrate 1. In addition, at the interfaces between the bottom portions 2102 except the end portions 2101 of the Schottky sources/drains 10 and the semiconductor substrate 1, the N-type dopant is segregated more than the P-type dopant. Thanks to the segregation of the dopants, compared with the Schottky barrier height at the interface between the end portion 2101 of the Schottky source 10 and the semiconductor substrate 1 and with the Schottky barrier height at the interface between the end portion 2101 of the Schottky drain 10 and the semiconductor substrate 1, the Schottky barrier height at the interfaces between the bottom portions 2102 except the end portions of the Schottky sources/drains 10 and the semiconductor substrate 1 is larger.

<Effects>

In the N-type SBMOSFET in the semiconductor device of the present embodiment, the N-type dopant is segregated more than the P-type dopant at the interface between the end portion 1101 of the Schottky source and the semiconductor substrate 1 and at the interface between the end portion 1101 of the Schottky drain and the semiconductor substrate 1. In addition, at the interfaces between the bottom portions 1102 except the end portions 1101 of the Schottky sources/drains 10 and the semiconductor substrate 1, the P-type dopant is segregated more than the N-type dopant. Thanks to the segregation of the dopants, compared with the Schottky barrier height for electrons at the interface between the end portion 1101 of the Schottky source 10 and the semiconductor substrate 1 and with the Schottky barrier height for electrons at the interface between the end portion 1101 of the Schottky drain 10 and the semiconductor substrate 1, the Schottky barrier height for electrons at the interfaces between the bottom portions 1102 except the end portions of the Schottky sources/drains 10 and the semiconductor substrate 1 is larger. In the P-type SBMOSFET in the semiconductor device of the present embodiment, when the nickel silicide is formed, the P-type dopant is segregated more than the N-type dopant at the interface between the end portion 2101 of the Schottky source and the semiconductor substrate 1 and at the interface between the end portion 2101 of the Schottky drain and the semiconductor substrate 1. In addition, at the interfaces between the bottom portions 2102 except the end portions 2101 of the Schottky sources/drains 10 and the semiconductor substrate 1, the N-type dopant is segregated more than the P-type dopant. Thanks to the segregation of the dopants, compared with the Schottky barrier height for electron holes at the interface between the end portion 2101 of the Schottky source 10 and the semiconductor substrate 1 and with the Schottky barrier height for electron holes at the interface between the end portion 2101 of the Schottky drain 10 and the semiconductor substrate 1, the Schottky barrier height for electron holes at the interfaces between the bottom portions 2102 except the end portions of the Schottky sources/drains 10 and the semiconductor substrate 1 is larger.

Thanks to the adoption of the above configuration, it is possible to make the barrier heights at the side faces of the sources and drains different from the barrier height at the bottoms of the sources and drains. As a result, it is possible to suppress a current from the bottoms of the sources and drains as well as to improve an ON current.

According to the method of producing the semiconductor device of the present embodiment, the resist, ion implantation and silicidation steps that have already been established in semiconductor production processes are used to obtain the above CMOS device where the N-type and P-type SBMOSFETs are combined. Therefore, it is possible to realize a simple, low-cost production process.

The above has described the embodiments of the present invention. However, the present invention is not limited to the above embodiments. The present invention may be embodied by selecting materials and structures without departing from the scope of the present invention.

Figure 10:
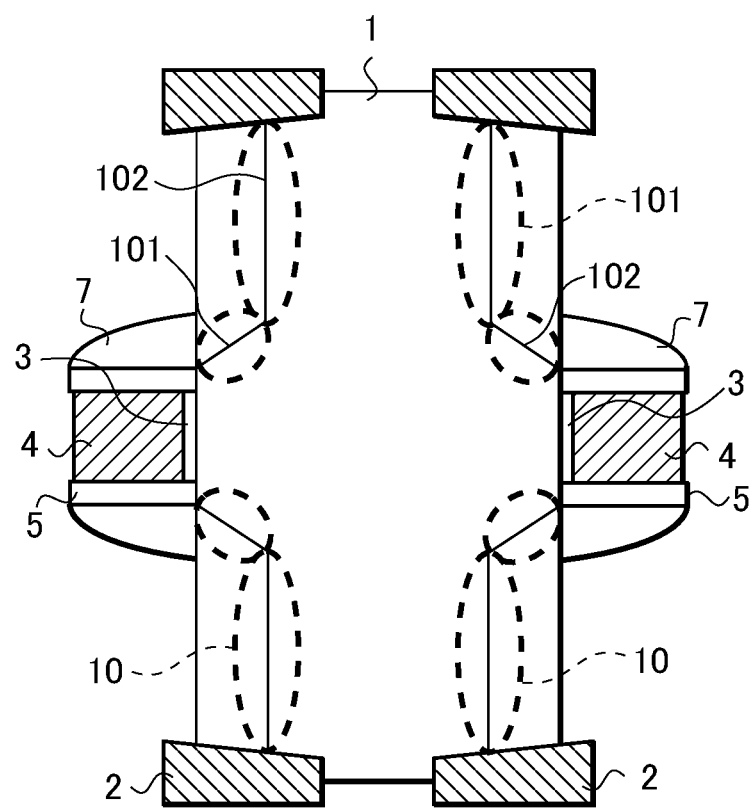
FIG. 10 A cross-sectional diagram showing a semiconductor production device according to a third embodiment of the present invention.
Figure 11:
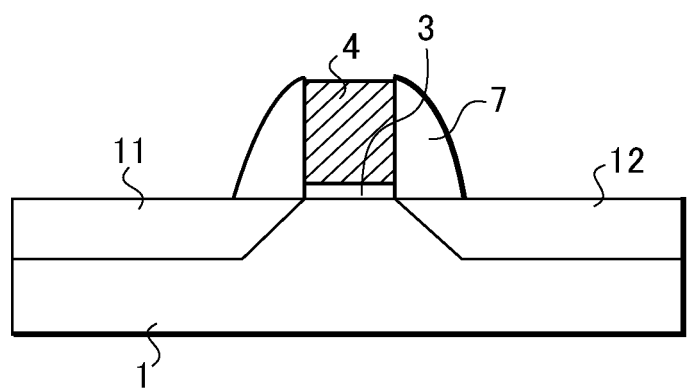
FIG. 11 A cross-sectional diagram showing a conventional SBMOSFET semiconductor production device.
Figure 12A:
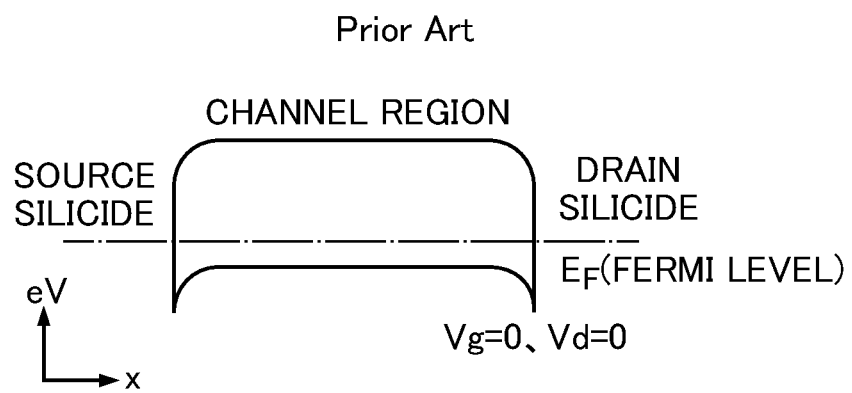
FIGS. 12A and 12B Diagrams showing an energy band of a semiconductor surface of an SBMOSFET.
Figure 12B:
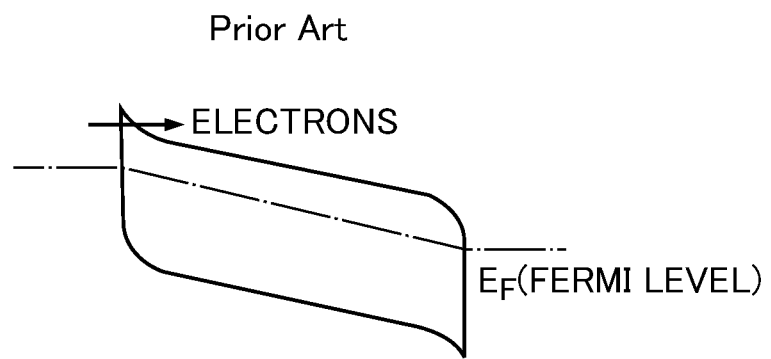

For example, according to the present embodiment, the application of a silicon substrate as the substrate has been described. However, the substrate may be a semiconductor substrate made of other materials, not a silicon substrate. Moreover, the application of nickel silicide to the Schottky sources/drains has been described. However, the Schottky sources/drains may not be nickel silicide; for example, $CoSi_2$ (cobalt silicide), $TiSi_2$ (titanium silicide), PtSi (platinum silicide), $ErSi_2$ (erbium silicide) or the like may be used. Moreover, in the above case, As is used as the N-type dopant. However, a dopant containing one of the following substances may be also used: N, P, Sb, Bi and S. Moreover, in the above case, B is used as the P-type dopant. However, a dopant containing one of the following substances may be also used: B, Al, Ga and In. Furthermore, it is possible to apply the present invention to a so-called vertical SBMOSFET as shown in FIG. 10. Even in this case, similar effects to those described above can be obtained.

Although the exemplary embodiments of the present invention have been described in detail, it should be understood that various changes, substitutions and alternatives can be made therein without departing from the sprit and scope of the invention as defines by the appended claims. Further, it is the inventor's intent to retain all equivalents of the claimed invention even if the claims are amended during prosecution.

REFERENCE SIGNS LIST

1: Silicon substrate
2: Element separation region
3: Gate insulating film
4: Gate electrode
5: Spacer
6: First ion implantation region
7: Sidewall
8: Second ion implantation region
9: Metal film
10: Silicide layer
11: Source silicide
12: Drain silicide
16: N-type diffusion region in N-type SBMOSFET formation area
18: P-type diffusion region in N-type SBMOSFET formation area
26: P-type diffusion region in P-type SBMOSFET formation area
28: N-type diffusion region in P-type SBMOSFET formation area
100: N-type SBMOSFET formation area
101: End portion of silicide layer
102: Bottom portion of silicide layer
200: P-type SBMOSFET formation area
1101: End portion of silicide layer of N-type SBMOSFET
1102: Bottom portion of silicide layer of N-type SBMOSFET
2101: End portion of silicide layer of P-type SBMOSFET
2102: Bottom portion of silicide layer of P-type SBMOSFET

The invention claimed is:

1. A semiconductor device including a gate electrode formed with interposition of a gate insulating film on a channel formed on a semiconductor substrate, and a Schottky source and a Schottky drain that are formed within a top surface of the semiconductor substrate so as to be positioned on both sides of the gate insulating film in such a way that end portions of the Schottky source and the Schottky drain do not cover a lower end portion of the gate insulating film and so as to form Schottky junctions with the semiconductor substrate, wherein the Schottky source and the Schottky drain comprise metal silicide, wherein at the interface between the end portion of the Schottky source and the semiconductor substrate and at the interface between the end portion of the Schottky drain and the semiconductor substrate, a dopant whose polarity is opposite to that inside the channel is segregated more than a dopant whose polarity is the same as that inside the channel, wherein at the interface between the portions except the end portions of the Schottky source and the Schottky drain and the semiconductor substrate, a dopant whose polarity is the same as that inside the channel is segregated more than a dopant whose polarity is opposite to that inside the channel, and whereby the Schottky barrier height at the interfaces between the portions except the end portions of the Schottky source and of the Schottky drain and the semiconductor substrate is larger than the Schottky barrier height at the interface between the end portion of the Schottky source and the semiconductor substrate and than the Schottky barrier height at the interface between the end portion of the Schottky drain and the semiconductor substrate.

2. The semiconductor device according to claim 1, wherein silicide of which the Schottky source and the Schottky drain are made includes at least Ni, Co, Ti, Pt, or Er.

3. The semiconductor device according to claim 2, wherein the segregated dopant, as a N-type dopant, includes at least one of N, P, As, Sb, Bi and S, and the segregated dopant, as a P-type dopant, includes at least one of B, Al, Ga and In.

4. The semiconductor device according to claim 3, wherein the gate insulating film is a high-permittivity gate insulating film.

5. The semiconductor device according to claim 4, wherein the gate electrode is a metal gate electrode.

6. A semiconductor device including a gate electrode formed with interposition of a gate insulating film on a channel formed on a semiconductor substrate, and a Schottky source and a Schottky drain that are formed within a top surface of the semiconductor substrate so as to be positioned on both sides of the gate insulating film in such a way that end portions of the Schottky source and the Schottky drain do not cover a lower end portion of the gate insulating film and so as to form Schottky junctions with the semiconductor substrate, wherein the Schottky source and the Schottky drain comprise metal silicide, wherein at the interface between the end portion of the Schottky source and the semiconductor substrate and at the interface between the end portion of the Schottky drain and the semiconductor substrate, a dopant whose polarity is opposite to that inside the channel is segregated more than a dopant whose polarity is the same as that inside the channel, and wherein at the interface between the portions except the end portions of the Schottky source and the Schottky drain and the semiconductor substrate, a dopant whose polarity is the same as that inside the channel is segregated more than a dopant whose polarity is opposite to that inside the channel.

* * * * *